United States Patent
Devins et al.

(10) Patent No.: US 7,353,131 B2
(45) Date of Patent: *Apr. 1, 2008

(54) METHOD AND SYSTEM FOR LOGIC VERIFICATION USING MIRROR INTERFACE

(75) Inventors: Robert J. Devins, Essex Junction, VT (US); Paul J. Ferro, South Burlington, VT (US); Peter D. LaFauci, Holly Springs, NC (US); Kenneth A. Mahler, Essex Junction, VT (US); David W. Milton, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 35 days.

This patent is subject to a terminal disclaimer.

(21) Appl. No.: 10/986,773

(22) Filed: Nov. 15, 2004
(Under 37 CFR 1.47)

(65) Prior Publication Data
US 2005/0144577 A1    Jun. 30, 2005

Related U.S. Application Data

(63) Continuation of application No. 09/826,035, filed on Apr. 4, 2001, now Pat. No. 6,865,502.

(51) Int. Cl.
*G01R 31/00* (2006.01)
*G01R 31/14* (2006.01)

(52) U.S. Cl. ..................... 702/118; 702/117

(58) Field of Classification Search ........ 702/117–119, 702/182; 716/4, 5; 714/741, 742
See application file for complete search history.

(56) References Cited

U.S. PATENT DOCUMENTS

| | | | |
|---|---|---|---|
| 4,377,318 A | 3/1983 | Long | |
| 5,146,474 A | 9/1992 | Nagler et al. | |
| 5,414,695 A | 5/1995 | Nagler et al. | |
| 5,668,745 A | 9/1997 | Day | |
| 6,487,699 B1 * | 11/2002 | Devins et al. | 716/4 |
| 6,539,522 B1 | 3/2003 | Devins et al. | |
| 6,865,502 B2 * | 3/2005 | Devins et al. | 702/118 |
| 2007/0204246 A1 * | 8/2007 | Devins et al. | 716/5 |

* cited by examiner

*Primary Examiner*—Michael Nghiem
(74) *Attorney, Agent, or Firm*—Connolly Bove Lodge & Hutz LLP; Anthony Canale

(57) ABSTRACT

Verification of external interfaces of cores on system-on-chip (SOC) designs frequently entails the purchase of costly standardized software models to test the external interfaces. Typically, the standardized models provide more functionality than is needed. Instead of standardized models, test models may be developed and utilized, but this also incurs cost and delay. The present invention provides an efficient and economical alternative. A mirror interface, or copy of the external interface undergoing verification, is used with a standardized control mechanism to verify the external interface. Because all interface I/O connections can thereby be utilized, a cost-effective and highly reusable way of verifying such interfaces is provided.

2 Claims, 5 Drawing Sheets

METHOD AND SYSTEM FOR LOGIC VERIFICATION USING MIRROR INTERFACE

CROSS REFERENCE TO RELATED APPLICATIONS

This application is a continuation of U.S. application Ser. No. 09/826,035, filed Apr. 4, 2001, now issued as U.S. Pat. No. 6,865,502. This application is related by common inventorship and subject matter to application titled "Method of Developing Re-Usable Software For Efficient Verification of System-On-Chip Integrated Circuit Designs," U.S. application Ser. No. 09/494,907, now issued as U.S. Pat. No. 6,539,522. The listed application is assigned to International Business Machines Corporation and is entirely incorporated herein by reference.

BACKGROUND OF THE INVENTION

The present invention relates generally to the verification of integrated circuit (IC) logic, and more particularly to a method and system for increasing the efficiency and re-usability of verification software.

Before ICs are released to market, the logic designs incorporated therein are typically subject to a testing and de-bugging process known as "verification." Verification of logic designs using simulation software allows a significant number of design flaws to be detected and corrected before incurring the time and expense needed to physically fabricate designs.

Software verification typically entails the use of software "models" of design logic. Such models may be implemented as a set of instructions in a hardware description language (HDL) such as Verilog® or VHDL®. The models execute in a simulation environment and can be programmed to simulate a corresponding hardware implementation. The simulation environment comprises specialized software for interpreting model code and simulating the corresponding hardware device or devices. By applying test stimuli (typically in batches known as "test cases") to a model in simulation, observing the responses of the model and comparing them to expected results, design flaws can be detected and corrected.

Advances in technology have permitted logic designs to be packed with increased density into smaller areas of silicon as compared with past IC devices. This has led to "system-on-a-chip" (SOC) designs. The term "SOC" as used herein refers to combinations of discrete logic blocks, often referred to as "cores," each performing a different function or group of functions. A SOC integrates a plurality of cores into a single silicon device, thereby providing a wide range of functions in a highly compact form. Typically, a SOC comprises its own processor core (often referred to as an "embedded" processor), and will further comprise one or more cores for performing a range of functions often analogous to those of devices in larger-scale systems.

In its developmental stages a core is typically embodied as a simulatable HDL model written at some level of abstraction, or in a mixture of abstraction levels. Levels of abstraction that are generally recognized include a behavioral level, a structural level, and a logic gate level. A core may be in the form of a netlist including behavioral, structural and logic gate elements.

Verification of a SOC presents challenges because of the number of cores and the complexity of interactions involved, both between the cores internally to the SOC, and between the SOC and external logic. An acceptable level of verification demands that a great number of test cases be applied, both to individual components of the SOC, and to the cores interconnected as a system and interfacing with logic external to the SOC. There is a commensurate demand on computer resources and time. Accordingly, techniques which increase the efficiency of verification are at a premium.

According to one standard technique, already-verified models are used to test other models. The electronic design automation (EDA) industry has reached a level of sophistication wherein vendors offer standardized models for use in verification of other models still in development. In particular, such models are typically used for testing cores in a SOC that have external interfaces (i.e., communicate with logic external to the SOC). Such standardized models save the purchaser development resources, are typically well-tested and reliable, and are designed to have a wide range of applicability.

However, there are disadvantages associated with using standardized models. For instance, they can be very costly. Moreover, they can be very complex and provide much more functionality than is needed by the purchaser if only a subset of functions are required. Further, the standardized models must be integrated into existing verification systems, incurring more cost in terms of time and effort.

Alternatively to purchasing and using standardized models, designers may, of course, develop their own testing models. However, this is costly in terms of development time, with the typical result that such models are designed for limited application. Accordingly, they typically have limited functionality and re-usability.

An approach is needed to address the concerns noted in the foregoing.

SUMMARY OF THE INVENTION

The present invention overcomes shortcomings of existing art by providing an efficient and economical method and system for testing external interfaces of cores in an SOC. According to the invention, a mirror interface is attached to an external interface of a core undergoing verification. The mirror interface is a copy or duplicate of the interface undergoing verification.

In a preferred embodiment, a standardized, programmable control mechanism is utilized to enable a test case executing in the SOC, for purposes of verifying the external interface, to configure the mirror interface as needed for data transfers to and from the external interface. The control mechanism controls data flow, transfer direction, and data checking.

In the foregoing embodiment, the mirror interface is attached to a bus functional model containing a memory model for storing data received from the external SOC interface during testing, and a processor model for emitting CPU bus cycles. A bi-directional communication mechanism is provided to enable communication between the SOC and the control mechanism.

Because the mirror interface is an exact copy of the external interface undergoing verification, all the I/O connections of the interfaces can be used. Morever, because the control mechanism is standardized, the invention is highly re-usable. Further, the control mechanism is programmable to be readily adaptable to different interfaces.

DETAILED DESCRIPTION OF THE INVENTION

Figure 1A:
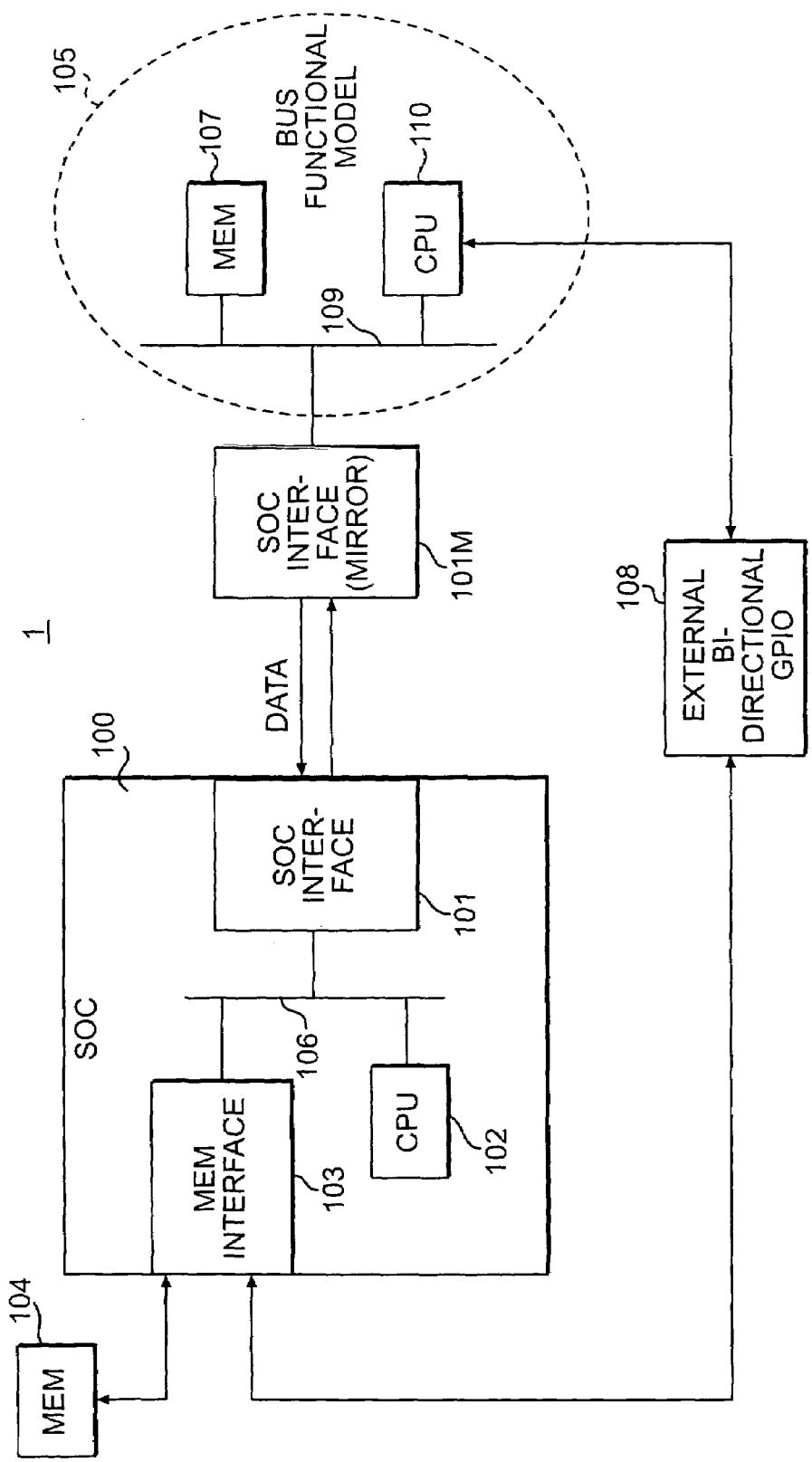
FIG. 1A shows a verification test bench according to the present invention.

FIG. 1A shows an embodiment of the present invention in the form of a verification test bench 1. The term "test bench" is well known in the simulation/verification field, and refers to a compiled and simulation-ready computer program including a model or models to be simulated. A verification test bench provides all of the external stimulus needed to test a SOC or part of an SOC, and receives stimulus from the SOC. The test bench is provided with the stimulus for a particular test case, and then compiled by a simulator. The simulator loads the compiled test bench into the simulator to conduct the test case.

Thus, FIG. 1A (and FIGS. 1B and 2, discussed in greater detail below) are to be understood, in general terms, as representing a software simulation of a physical system. Accordingly, when terms such as "connected," "attached" or "coupled," as represented by lines connecting block elements in the Figures, are used in the following, reference is being made to a software counterpart of physical means for propagating signals between block elements.

As shown in FIG. 1A, a SOC 100 includes a core 101 having an external SOC interface. An example of core having an external interface is the peripheral component interconnect (PCI) interface core used in many systems throughout the electronics industry, which interfaces with an external PCI bus. For example, if the SOC is part of a circuit card, and the circuit card has a PCI bus attached to another device, the PCI core would interface with the device via the bus.

The core 101 is connected via a processor bus 106 to an embedded processor (central processing unit or CPU) core 102. Also connected to the processor bus 106 is a memory controller core 103 having an interface to a memory 104 external to the SOC.

In the example of FIG. 1A, the core 101 is undergoing verification of its external SOC interface. According to the invention, a mirror interface 101M is connected to the core 101 undergoing verification of its external interface. The mirror interface 101M is a copy of the interface undergoing verification. (It is noted that, as used herein, the term "interface" refers to the set of input and output signals by means of which a core or model communicates with other logic. It is further noted that the terms "core" and "core interface" or "interface" are interchangeable in the respect that, regardless of its internal structure, any core may be defined in terms its interface where communication with other logic is concerned.)

Because the mirror interface is simply a copy of an already existing interface, there is no need to develop a new test model or purchase a costly standardized model. Moreover, the interface-to-interface coupling is, in effect, "ready-made," since the mirror interface has exactly the same inputs and outputs as the interface undergoing verification.

A bus functional model (BFM) 105 is attached to the external mirror interface 101M. BFMs are well known in the simulation/verification field. The BFM essentially models an internal SOC bus 109 and a processor model 110 for emitting CPU bus cycles to emulate the behavior of a processor, but without requiring the computer resources needed to fully simulate an actual processor. A memory model 107 is also attached to the BFM, so that if any data is sent through the interface 101, off the SOC to the external mirror interface 101M, the data can be stored in the memory model 107 and retrieved and checked if needed.

The invention further comprises a consistent, standardized control mechanism which is easily adaptable to different interfaces. The standardized control mechanism comprises a standardized "handshake," or communication protocol, between the SOC and the external mirror interface. The control mechanism further comprises programmable control code executing in the BFM which controls data flow, transfer direction, and data checking. Because the code is programmable, it is easily adaptable to different interfaces. The control code may be implemented in a bus functional language (BFL).

An external bi-directional general purpose I/O (GPIO) 108 may be provided to allow communication between the SOC and external logic. The external bi-directional GPIO comprises a plurality of bi-directional buses which can be connected between the SOC and external models/cores. Internal logic in the GPIO provides for control and status monitoring of cores connected to the bi-directional buses by enabling functions including driving data on the buses, reading the current state of data on the buses, and capturing positive and negative edge transitions on the buses.

In conducting a given verification procedure on an external SOC interface, the particular set of verification stimuli that are applied to the SOC interface depends on a test case. The test case is typically designed to conduct a range of exercises for an interface, to determine whether it performs as expected. The test case generates specified stimuli, for example, directives to read or write data. The test case receives results corresponding to the stimuli, and compares them against expected results to verify correct performance.

The test case utilizes the standardized control mechanism of the invention to direct the application of test stimuli to an external SOC interface as desired. The test case executes in the SOC and issues directives in the standardized handshake protocol for initiating and controlling operations by the mirror interface.

A typical test case comprises exchanging data between the SOC interface 101 and its external mirror counterpart 101M. To prepare for the exchange of data, a given interface must typically be appropriately configured, i.e., programmed to receive and/or send data, store data and the like. The test case utilizes the GPIO 108 to configure and control the external mirror interface 101M via the BFM 105. Using the standardized handshake, the test case generates control directives in the form of signals which are transmitted via the GPIO to the control code executing in the BFM. The code continuously waits for the GPIO input to the BFM to determine whether some action is being required of the mirror interface by a test case.

Figure 1B:
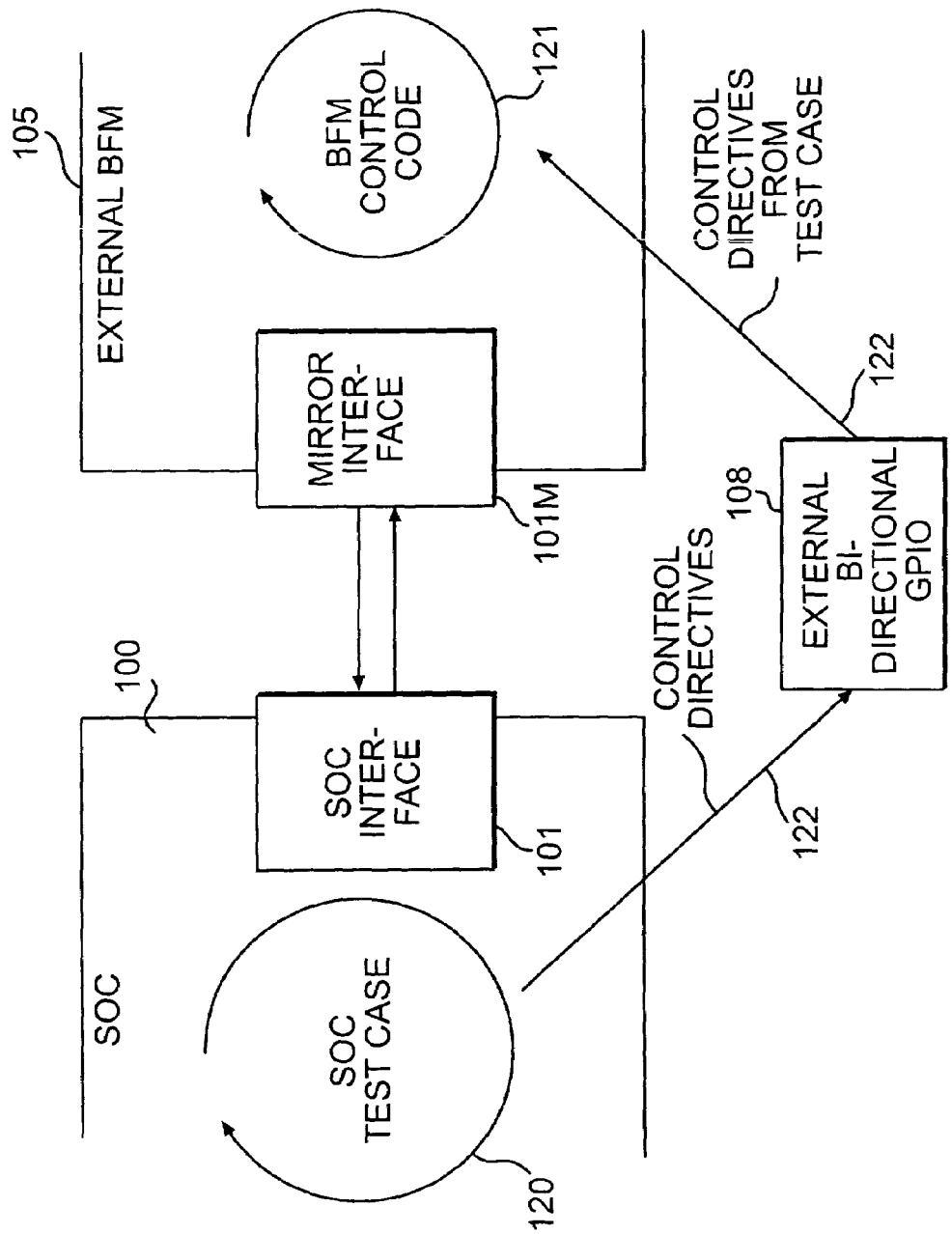
FIG. 1B shows execution domains of a test case and the control mechanism according to the invention.

FIG. 1B illustrates execution domains of the test case and control code according to the invention. A test case 120 executes in the SOC 100 and issues control directives 122 to the control code 121 executing in the BFM 105. The GPIO 108 transfers the control directives from the SOC to the BFM.

Figure 2:
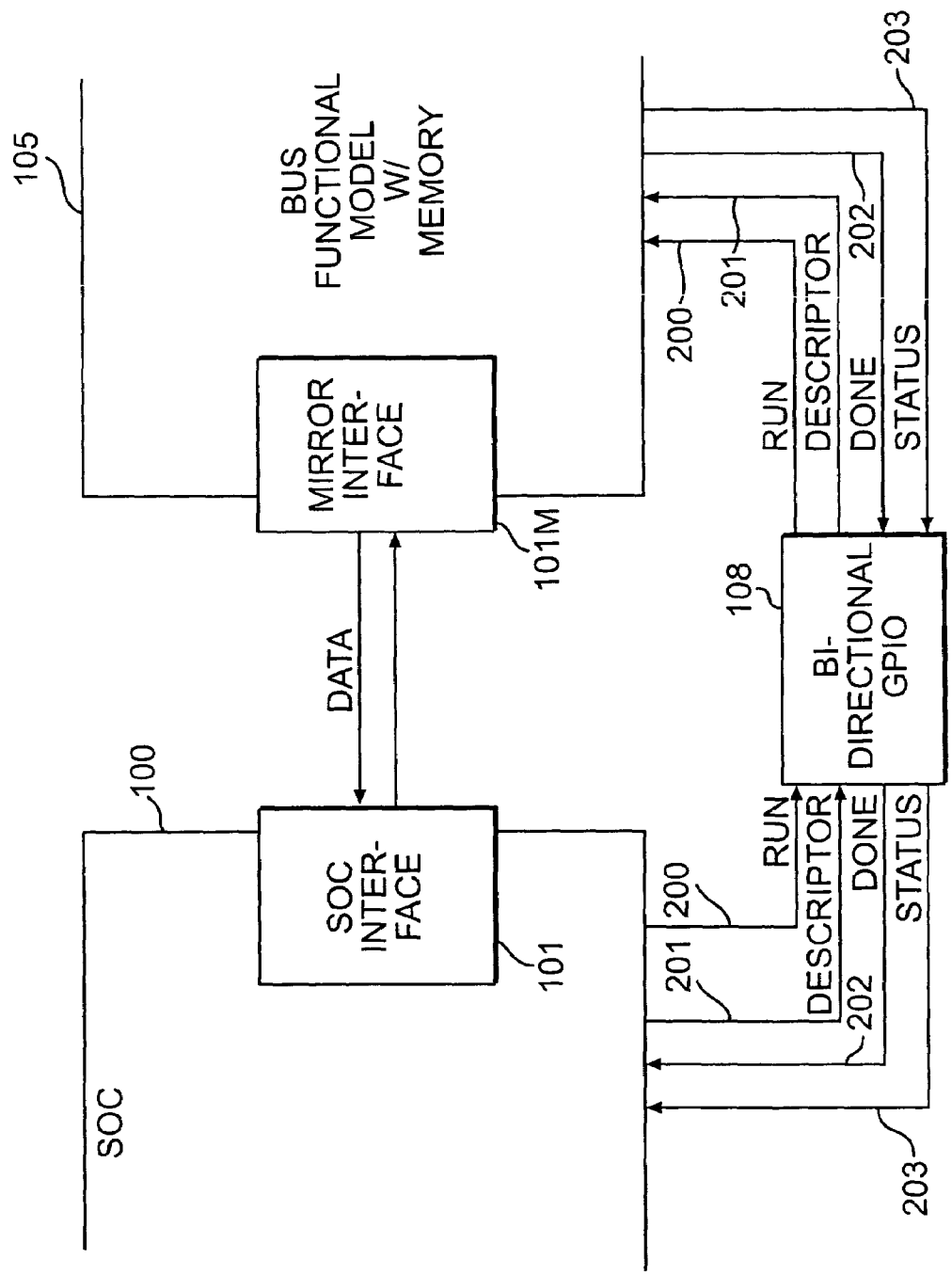
FIG. 2 shows connections and signals exchanged between a SOC and a bus functional model and mirror interface via a bi-directional general purpose I/O device.

FIG. 2 illustrates connections between the SOC 100 and GPIO 108, and GPIO 108 and BFM 105, in greater detail. An application by a test case of a data transfer process for verifying an SOC interface according to the invention is discussed in the following with reference to FIG. 2.

To transfer data from the SOC interface 101 to the mirror interface 101M, a test case executing in the SOC utilizes control directives including, for example, RUN 200, DESCRIPTOR 201, DONE 202 and STATUS 203 signals of the standardized handshake protocol. First, the test case sends a RUN signal 200 and a DESCRIPTOR signal 201 to the bi-directional GPIO 108. The RUN signal tells the code executing in the BFM to configure the mirror interface for a data transfer. The DESCRIPTOR signal includes such information as data transfer direction (in this case, from the SOC interface 101 to the mirror interface 101M), the number of pieces of data to transfer, the size of the data pieces, the transfer mode, and the like.

The GPIO 108 transfers the RUN and DESCRIPTOR signals to the BFM 105, and the test case waits to receive a DONE signal 202 from the BFM indicating that the configuration of the mirror interface is complete.

The GPIO transfers the DONE signal from the BFM to the test case executing in the SOC. When the test case detects the DONE signal, it begins the data transfer. The control code replies with a STATUS signal and the DONE signal after the data has been received, and the test case evaluates the STATUS signal (good/bad) and reports the results.

To transfer data from the mirror interface 101M to the SOC interface 101, a test case executing in the SOC sends the RUN and DESCRIPTOR signals via the GPIO to the BFM. In this case, the direction parameter of the DESCRIPTOR signal specifies that the data transfer is from the mirror interface to the SOC interface.

The test case waits to receive a DONE signal 202 from the BFM indicating that the configuration of the mirror interface is complete. When the test case detects the DONE signal, it sends a RUN signal 200 back to the BFM, and expects the data transfer from the mirror interface to the SOC interface to begin.

The mirror interface 101M transfers data to the SOC interface 101, and sends STATUS and DONE signals after it has finished transferring the data. The SOC test case detects the DONE signal and evaluates the received data to determine success or failure. The STATUS signal reports whether any transfer errors were detected by the BFM.

As noted above, the control code executes in the BFM attached to the mirror interface. The control code functions, in part, as the external surrogate of the test case executing in the SOC, performing operations analogous to test case operations, based on the handshake signals generated by the test case.

Figure 3:
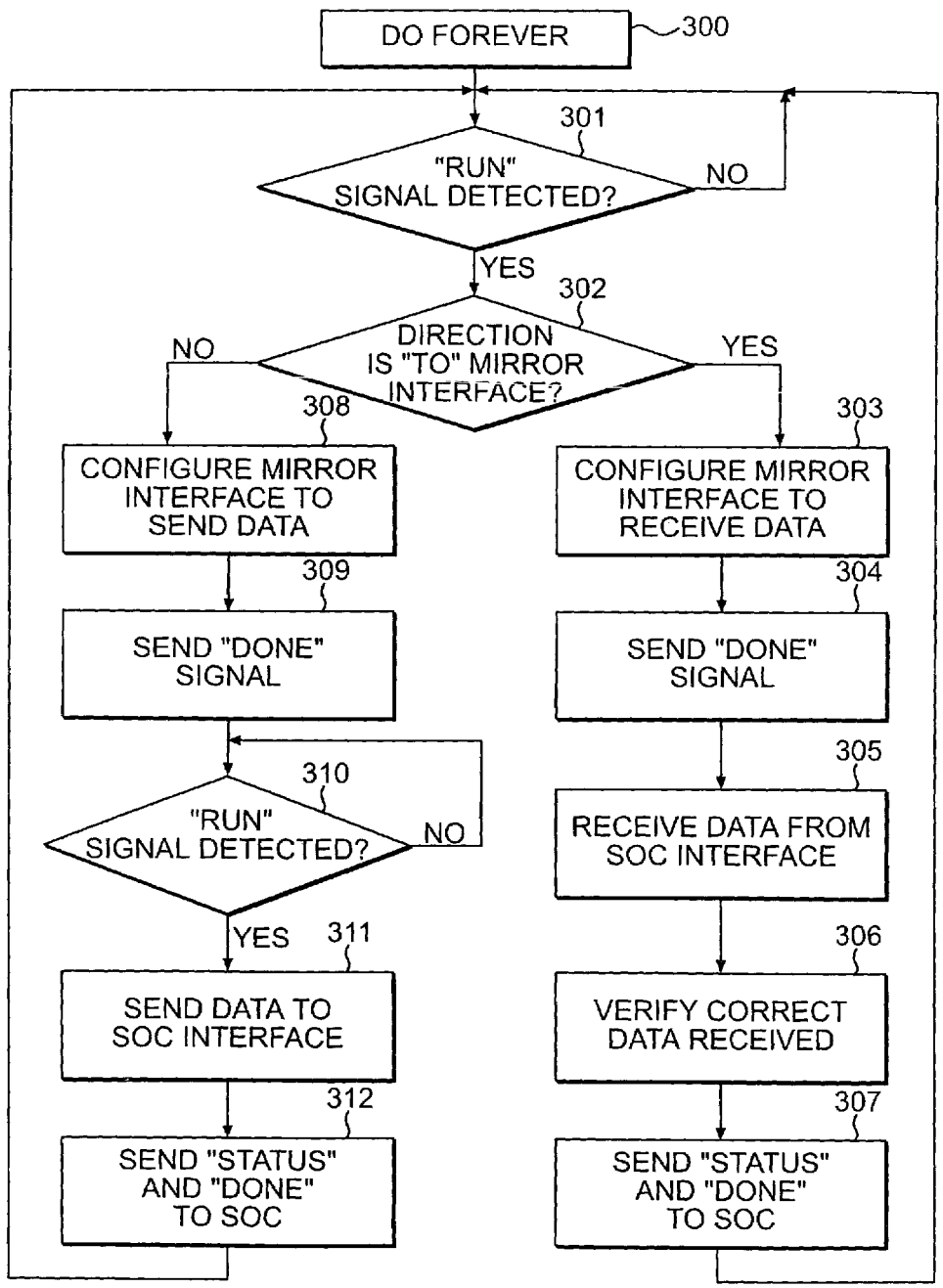
FIG. 3 shows a process flow of control code for handling data flow, transfer direction, and data checking.

A process flow for the control code, according to one possible formulation, is shown in FIG. 3. As shown in blocks 300 and 301, the control code waits continuously for a RUN signal from the test case executing in the SOC.

Depending on the direction information of the DESCRIPTOR signal, the code configures the mirror interface to either send or receive data, as shown in blocks 302, 303 and 308. The configuration is the only portion of the control code which is interface-dependent, and it can be readily altered to adjust to whatever interface is being verified.

If the mirror interface is to receive data, the control code sends the DONE signal to the SOC once the mirror interface is configured, as shown in block 304. Then, the test case sends the data through the SOC interface 101 to the mirror interface 101M, as shown in block 305. The control code includes logic for verifying whether the correct data was received, as shown in block 306. The code sends STATUS and DONE signals back to the SOC, reporting that the data transfer is finished and whether it was successful, as shown in block 307.

If the mirror interface is to send data, the control code sends the DONE signal to the SOC once the mirror interface is configured, as shown in blocks 308-309. Then, as shown in block 310, the control code waits for a RUN signal from the test case.

When the RUN signal is received, the control code sends the data through the mirror interface 101M to the SOC interface 101, and thereby to the test case executing in the SOC, as shown in block 311. When it is finished sending data, the control code sends STATUS and DONE signals to the SOC, reporting that the data transfer is finished, as shown in block 312. The test case can then evaluate to data to determine whether the transfer was successful.

It may be appreciated that the invention as disclosed hereinabove provides considerable advantages. The invention is highly reusable with different interfaces because of the programmable nature of the control code executing in the mirror interface. Moreover, the invention provides precisely the amount of functionality needed because the test interface is a mirror copy of the interface undergoing verification, and accordingly all or a subset of all interface I/O connections can be used. Additionally, the use of costly standardized test models is avoided.

Figure 4:
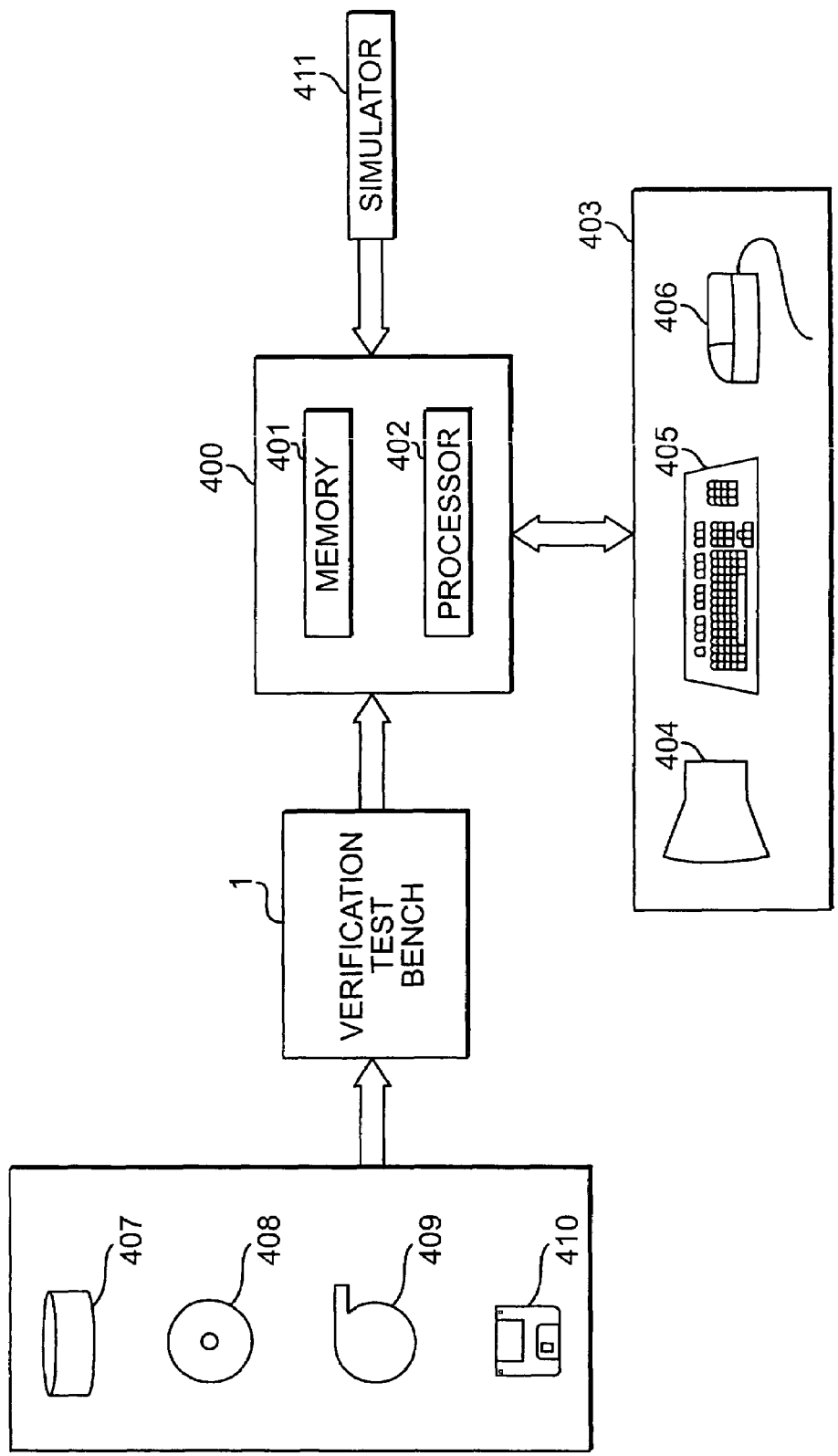
FIG. 4 shows a general purpose computer system for implementing the invention.

FIG. 4 shows a computer system which can used to implement the present invention. The system includes a computer 400 comprising a memory 401 and processor 402 which may be embodied, for example, in a workstation. The system may include a user interface 403 comprising a display device 404 and user input devices such as a keyboard 405 and mouse 406.

The verification test bench 1, as noted above, may be implemented as computer-executable instructions which may be stored on computer-usable media such as disk storage 407, CD-ROM 408, magnetic tape 409 or diskette 410. The instructions may be read from a computer-usable medium as noted into the memory 401 and executed by the processor 402 to effect the advantageous features of the invention.

A simulator 411 loaded into computer memory 401 and executed by processor 402 interprets a compiled verification test bench 1 to simulate hardware devices corresponding thereto. The simulator 411 may be any of a variety of commercially available simulators, including event simulators, cycle simulators and instruction set simulators.

Programming structures and functionality implemented in computer-executable instructions as disclosed hereinabove for performing steps of the method may find specific implementations in a variety of forms, which are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A computer program product tangibly embodied on a computer-readable medium, said program product comprising computer-executable instructions which when executed implement a process comprising the steps of:

connecting an external interface of a core on a system-on-chip (SOC) to a mirror interface of said external interface;

executing a test case in said SOC to apply test stimuli for verification of said external interface via said mirror interface; and executing a control mechanism for enabling said test case to control said mirror interface, wherein said executing a control mechanism comprises:

receiving directives issued by said test case in a handshake protocol; and configuring said mirror interface for an exchange of data with said external interface in response to said directives.

2. A method for verifying an external interface of a core of a system on a chip (SOC) comprising:

modeling a mirror interface which is a copy of said external interface with a bus functional model so that said mirror interface and external interface can exchange data, and said bus functional model can control the flow of data through said external interface;

generating directives from a test case executing in said SOC to configure said mirror interface and transferring to the bus functional model said directives through an external bi-directional general purpose I/O control;

applying a test stimuli from the mirror interface to the external interface;

exchanging data between the external interface and mirror interface during a given test case; and storing in memory said data transferred from said external interface through said mirror interface.

* * * * *